(12) United States Patent
Lin et al.

(10) Patent No.: US 10,515,955 B1
(45) Date of Patent: Dec. 24, 2019

(54) METHODS OF MANUFACTURING TRANSISTOR GATE STRUCTURES BY LOCAL THINNING OF DUMMY GATE STACKS USING AN ETCH BARRIER

(71) Applicant: Taiwan Semiconductor Manufacturing Company, Ltd., Hsinchu (TW)

(72) Inventors: Chih-Han Lin, Hsinchu (TW); Kuei-Yu Kao, Hsinchu (TW); Shih-Yao Lin, Hsinchu (TW); Ming-Ching Chang, Hsinchu (TW); Chao-Cheng Chen, Hsinchu (TW); Syun-Ming Jang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/991,184

(22) Filed: May 29, 2018

(51) Int. Cl.
*H01L 27/088* (2006.01)
*H01L 21/762* (2006.01)
(Continued)

(52) U.S. Cl.
CPC ...... *H01L 27/0886* (2013.01); *H01L 21/3065* (2013.01); *H01L 21/76224* (2013.01);
(Continued)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/66545; H01L 29/66606; H01L 29/66871; H01L 29/7856; H01L 29/42372–4238; H01L 21/28114; H01L 21/823456
See application file for complete search history.

(56) References Cited

U.S. PATENT DOCUMENTS 9,449,975 B1 * 9/2016 Ching ............... H01L 27/0922
9,859,165 B1 * 1/2018 Wu ................. H01L 21/823437
(Continued)

FOREIGN PATENT DOCUMENTS

DE 102016103773 A1 4/2017
KR 20140143841 A 12/2014
(Continued)

*Primary Examiner* — Younes Boulghassoul
(74) *Attorney, Agent, or Firm* — Slater Matsil, LLP

(57) ABSTRACT

Example embodiments relating to forming gate structures, e.g., for Fin Field Effect Transistors (FinFETs), are described. In an embodiment, a structure includes first and second device regions comprising first and second FinFETs, respectively, on a substrate. A distance between neighboring gate structures of the first FinFETs is less than a distance between neighboring gate structures of the second FinFETs. A gate structure of at least one of the first FinFETs has a first and second width at a level of and below, respectively, a top surface of a first fin. The first width is greater than the second width. A second gate structure of at least one of the second FinFETs has a third and fourth width at a level of and below, respectively a top surface of a second fin. A difference between the first and second widths is greater than a difference between the third and fourth widths.

20 Claims, 17 Drawing Sheets

(51) Int. Cl.
    *H01L 29/66*     (2006.01)
    *H01L 21/8234*     (2006.01)
    *H01L 29/423*     (2006.01)
    *H01L 21/3065*     (2006.01)

(52) U.S. Cl.
    CPC ........... *H01L 21/823431* (2013.01); *H01L 21/823456* (2013.01); *H01L 29/42376* (2013.01); *H01L 29/66545* (2013.01); *H01L 29/66636* (2013.01)

(56) References Cited

U.S. PATENT DOCUMENTS

| | | | |
|---|---|---|---|
| 2004/0157457 A1 | 8/2004 | Xu et al. | |
| 2015/0287711 A1* | 10/2015 | Kim | H01L 27/0207 257/344 |
| 2016/0079353 A1 | 3/2016 | Chen et al. | |
| 2016/0099324 A1* | 4/2016 | Chang | H01L 21/28114 257/401 |
| 2017/0084493 A1* | 3/2017 | Han | H01L 21/823431 |
| 2017/0323831 A1* | 11/2017 | Jeong | H01L 21/3081 |
| 2018/0308842 A1* | 10/2018 | Lee | H01L 27/0886 |
| 2019/0088762 A1* | 3/2019 | Su | H01L 29/66545 |

FOREIGN PATENT DOCUMENTS

| | | |
|---|---|---|
| KR | 20170065418 A | 6/2017 |
| KR | 20170091983 A | 8/2017 |
| WO | 2013154842 A1 | 10/2013 |

\* cited by examiner

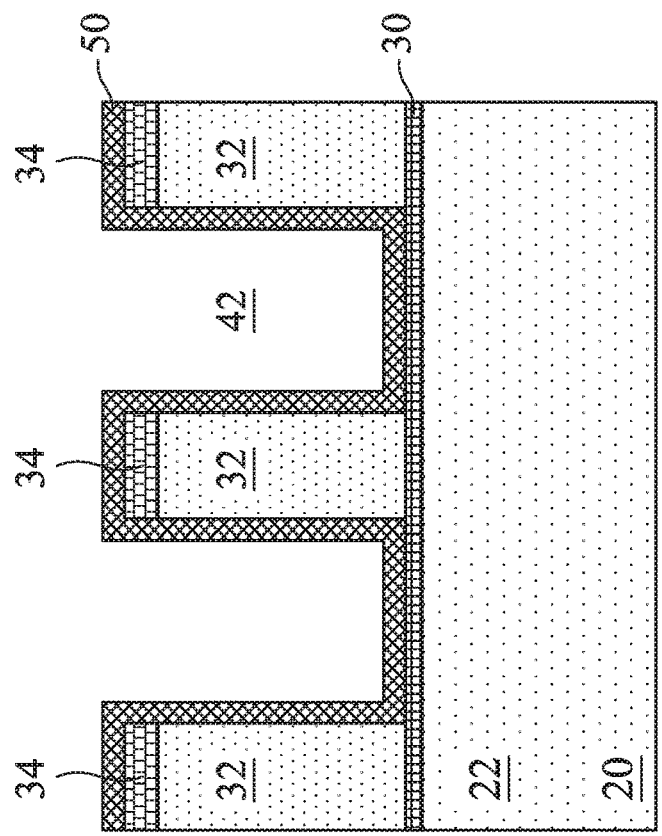
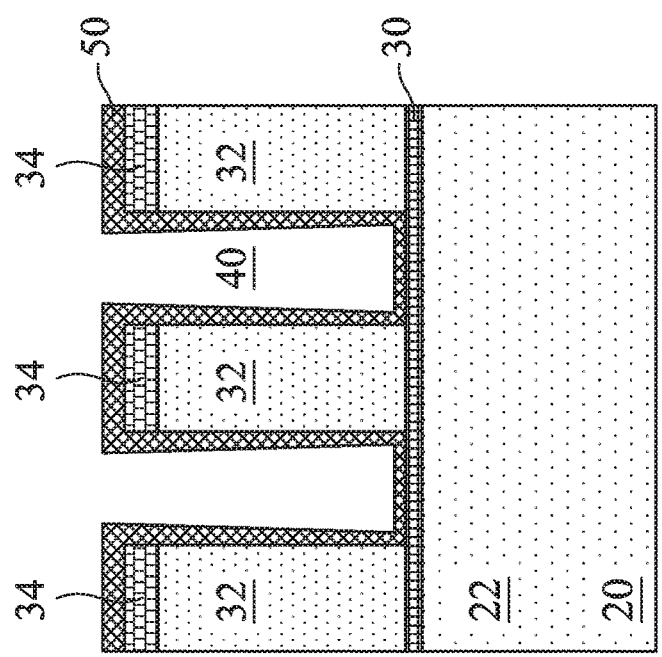
FIG. 4A
FIG. 4B

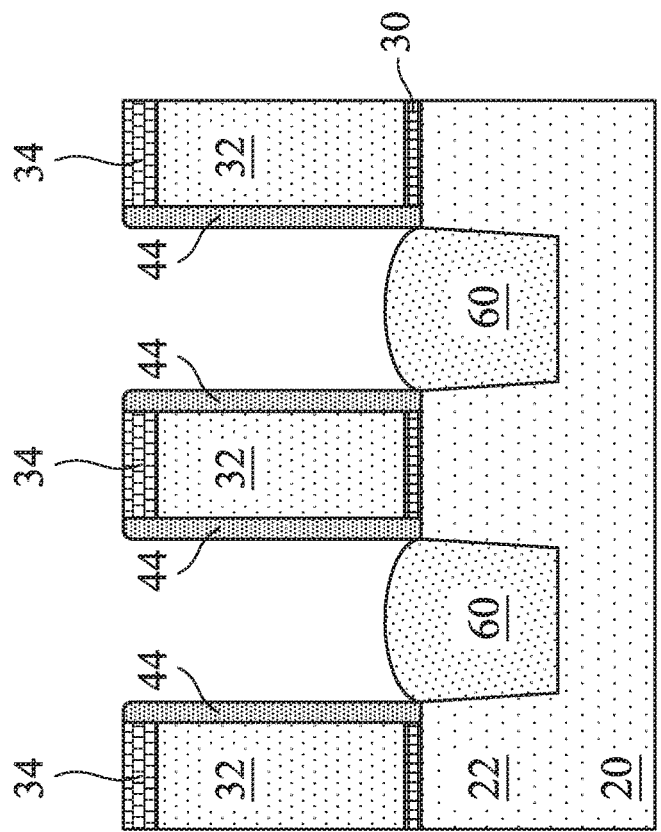
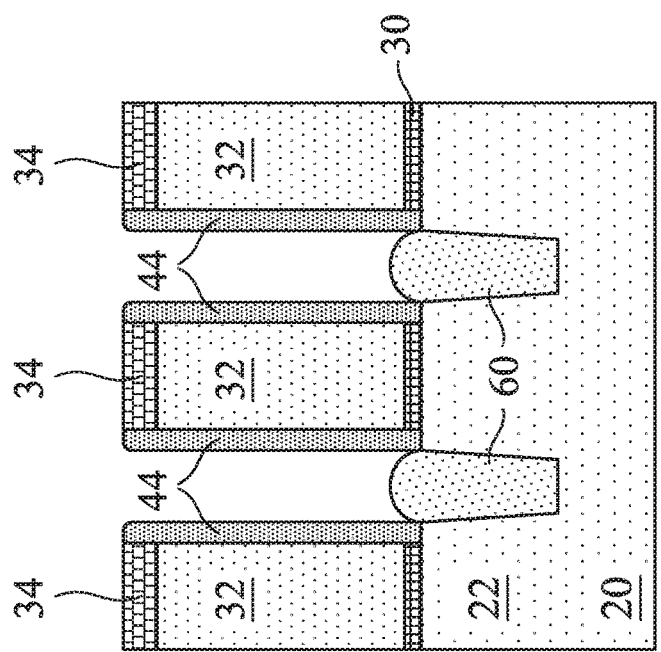
FIG. 6A
FIG. 6B

METHODS OF MANUFACTURING TRANSISTOR GATE STRUCTURES BY LOCAL THINNING OF DUMMY GATE STACKS USING AN ETCH BARRIER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges and/or opportunities that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2A-2E, 3A-3D, 4A-4D, 5A-5D, 6A-6D, 7A-7D, and 8A-8E are views of respective intermediate structures at respective stages during an example process for forming Fin Field Effect Transistors (FinFETs) in accordance with some embodiments.

DETAILED DESCRIPTION

Figure 1:
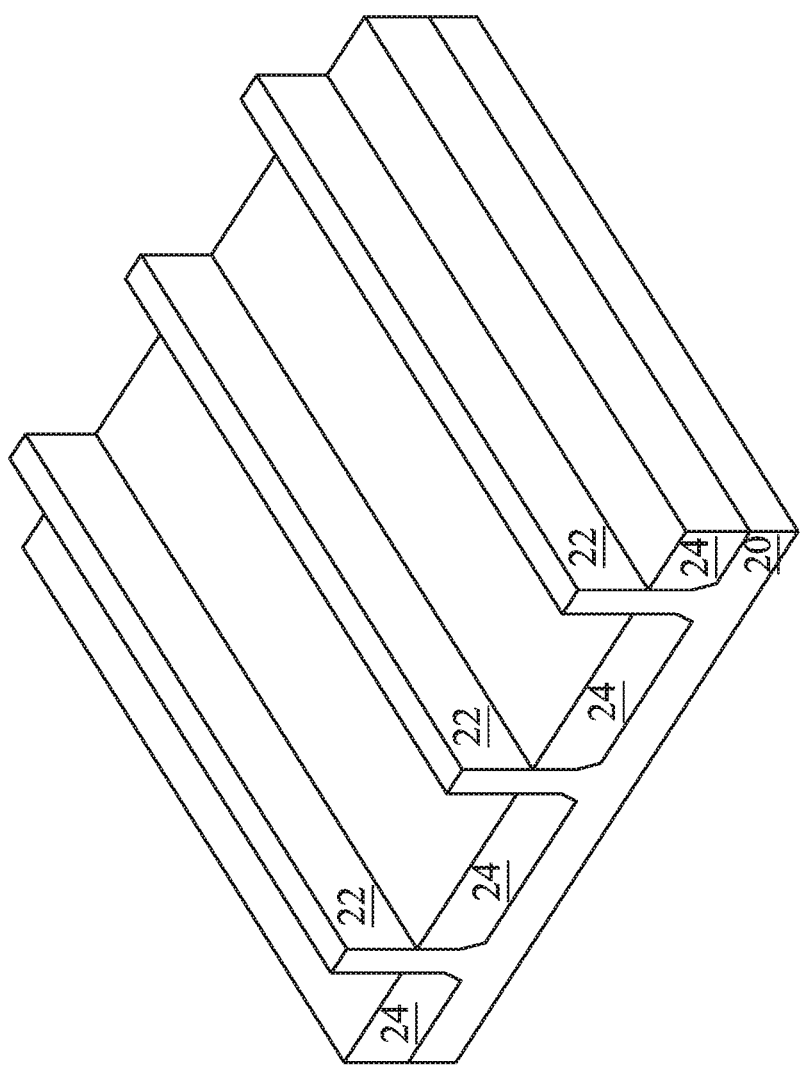

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to forming gate structures, e.g., for Fin Field Effect Transistors (FinFETs). More specifically, example embodiments described herein relate to forming dummy gate structures that are subsequently removed and replaced by replacement gate structures in a small gate pitch region and a large gate pitch region. In forming the dummy gate structures, a dummy gate layer is etched, treated, and etched further. Etching the dummy gate layer can result in a loading effect between the large gate pitch region and the small gate pitch region such that trenches etched in the dummy gate layer in the large gate pitch region are etched to a greater depth than trenches in the small gate pitch region. The treatment forms an etch barrier with varying thickness, such as due to a loading effect. The etch barrier and the dummy gate layer are then isotropically etched to obtain various profiles of the dummy gate layer to form dummy gate structures. The replacement gate structures may have corresponding profiles. The profiles can result in a lower leakage in devices formed in the small gate pitch region. Other benefits can be achieved.

Example embodiments described herein are described in the context of forming gate structures, such as replacement gate structures, for FinFETs. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1, 2A-2E, 3A-3D through 7A-7D, and 8A-8E illustrate views of respective intermediate structures at respective stages during an example process for forming FinFETs in accordance with some embodiments. FIG. 1 is a perspective view of a semiconductor substrate 20 having fins 22 formed thereon. The semiconductor substrate 20 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 20 may include an elemental semiconductor such as silicon (Si) or germanium (Ge); a compound semiconductor; an alloy semiconductor; or a combination thereof.

The fins 22 are formed on the semiconductor substrate 20, such as by etching trenches in the semiconductor substrate 20 to form the fins 22. The fins 22 may be patterned in the semiconductor substrate 20 by any suitable method. For example, the fins 22 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 22.

Isolation regions 24 are formed with each being in a corresponding trench. The isolation regions 24 may include or be an insulating material such as an oxide (such as silicon oxide), a nitride, the like, or a combination thereof, and the insulating material may be deposited using an appropriate deposition process. The insulating material may be recessed after being deposited to form the isolation regions 24. The insulating material is recessed such that the fins 22 protrude from between neighboring isolation regions 24, which may, at least in part, thereby delineate the fins 22 as active areas on the semiconductor substrate 20. A person having ordinary skill in the art will readily understand that the processes described above are just examples of how fins 22 may be formed. In other examples, the fins 22 may be formed by other processes and may include heteroepitaxial and/or homoepitaxial structures.

Figure 2A:
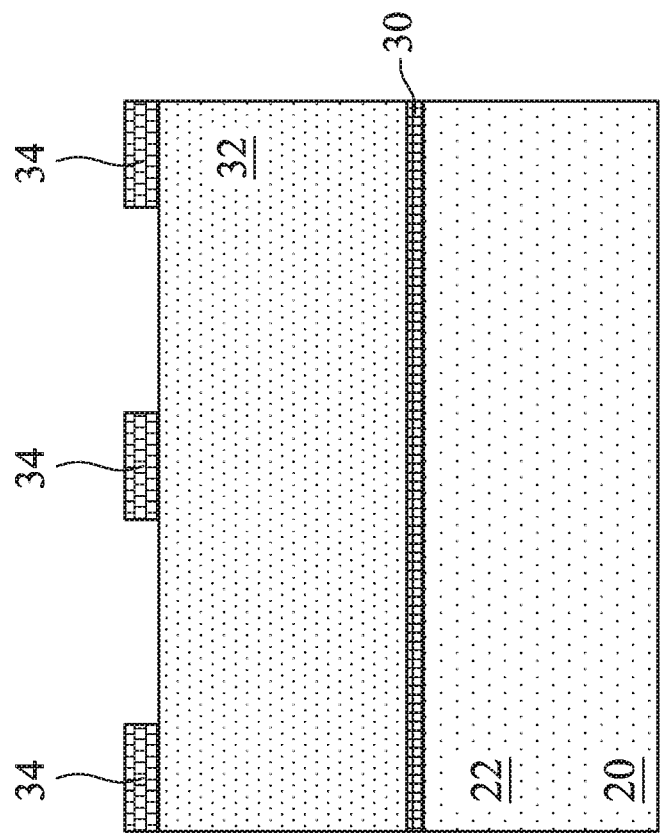
Figure 2B:
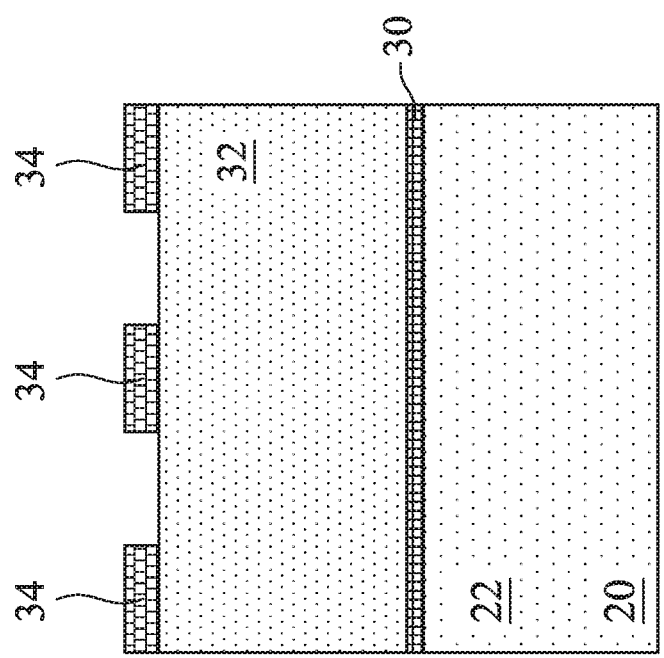
Figure 2C:
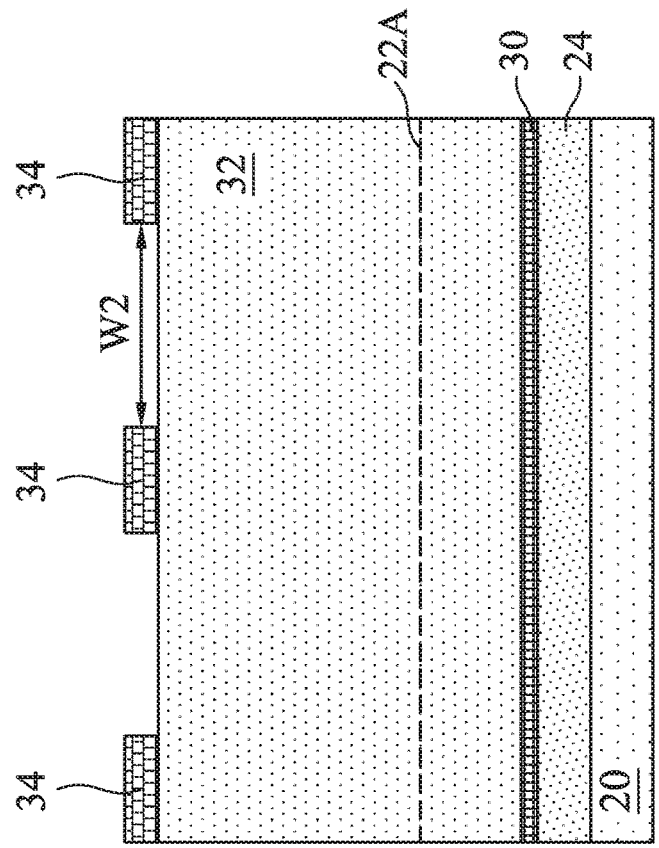
Figure 2D:
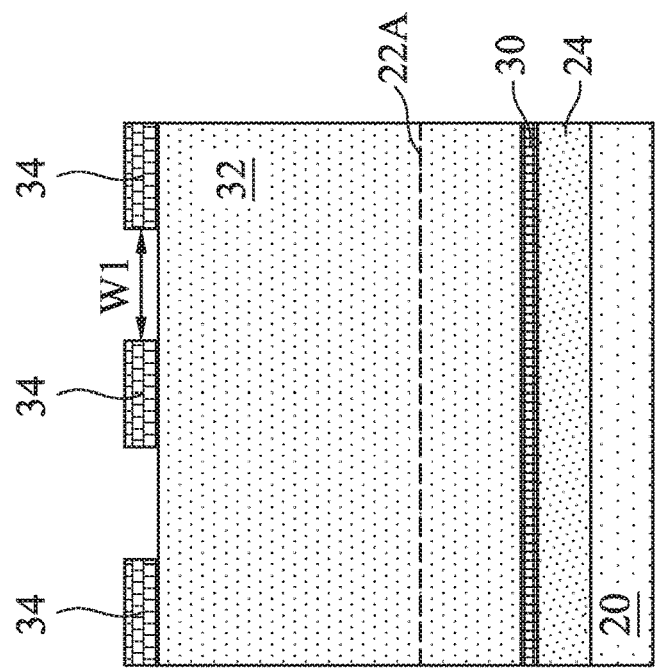
Figure 2E:
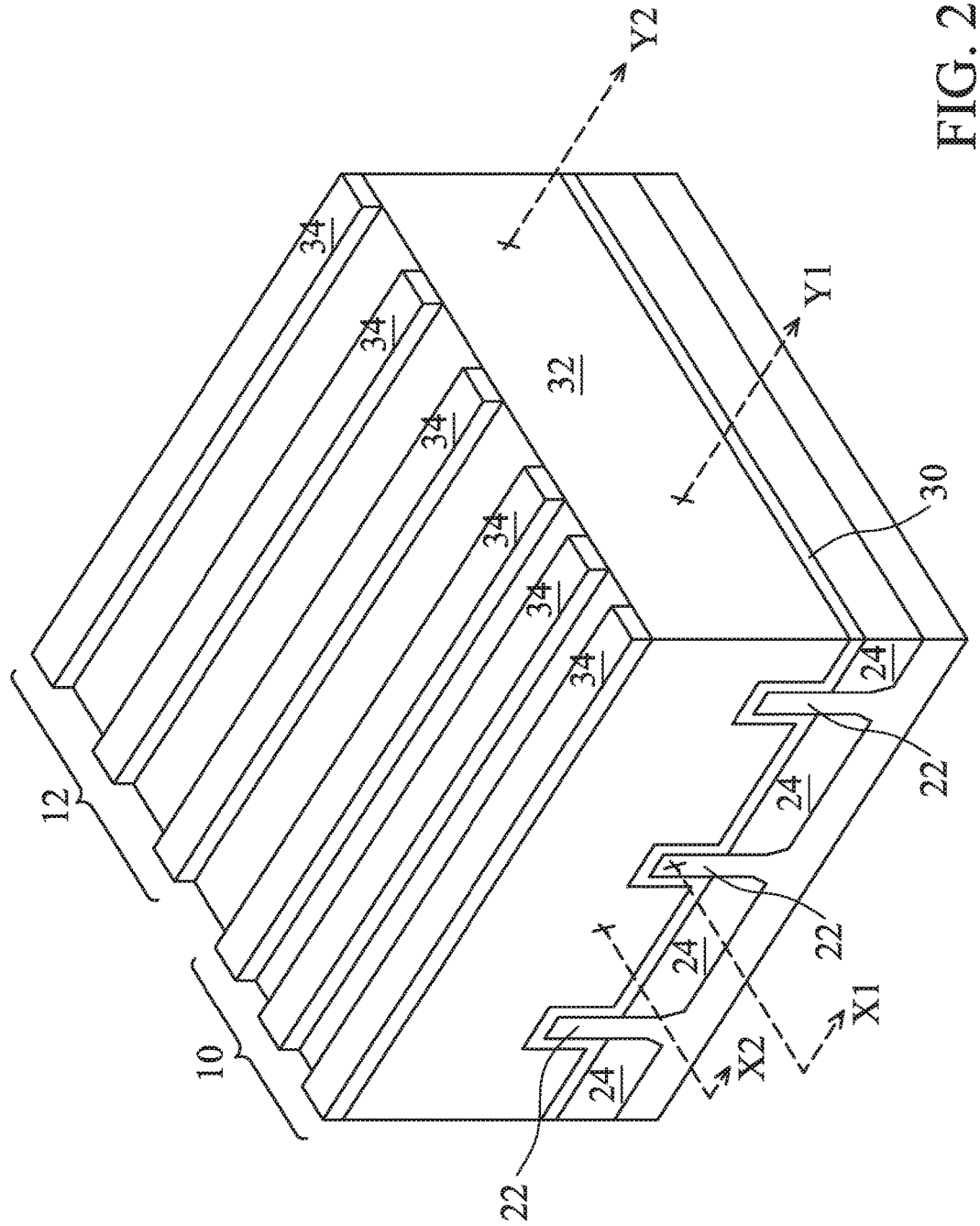
Figure 8A:
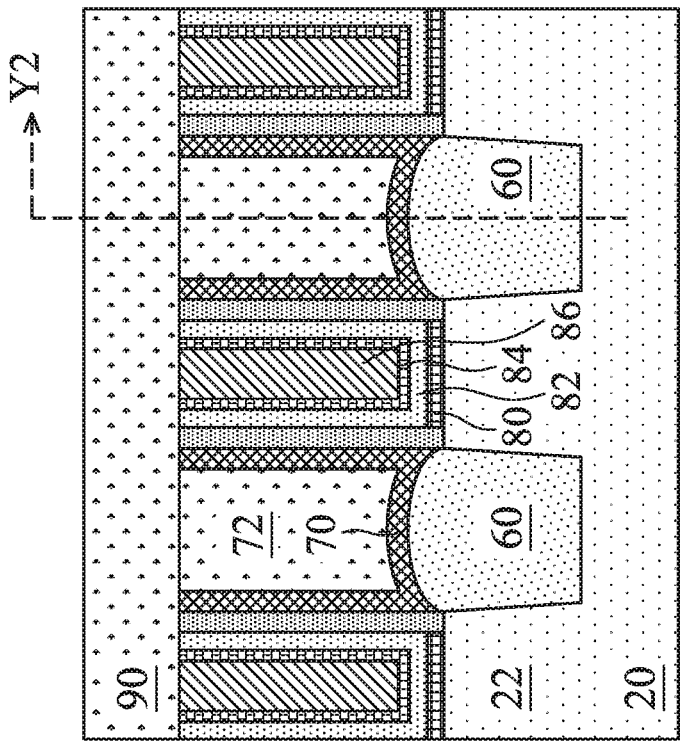
Figure 8B:
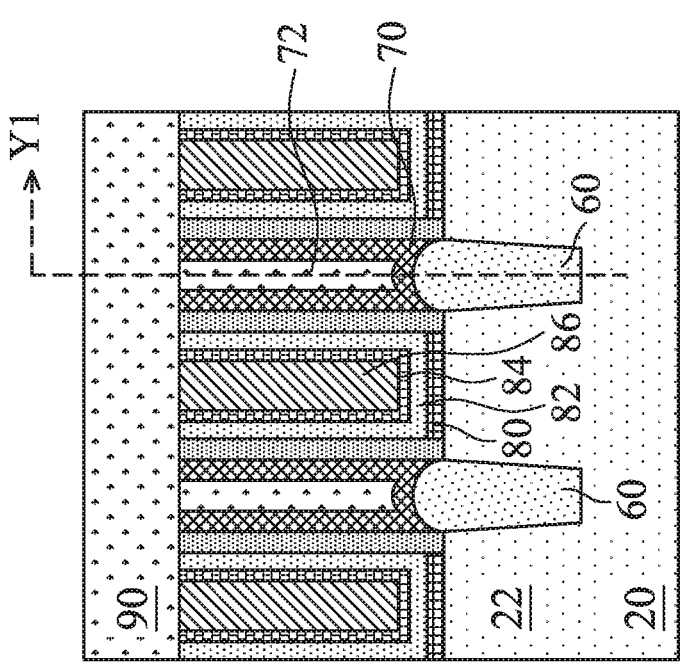
Figure 8C:
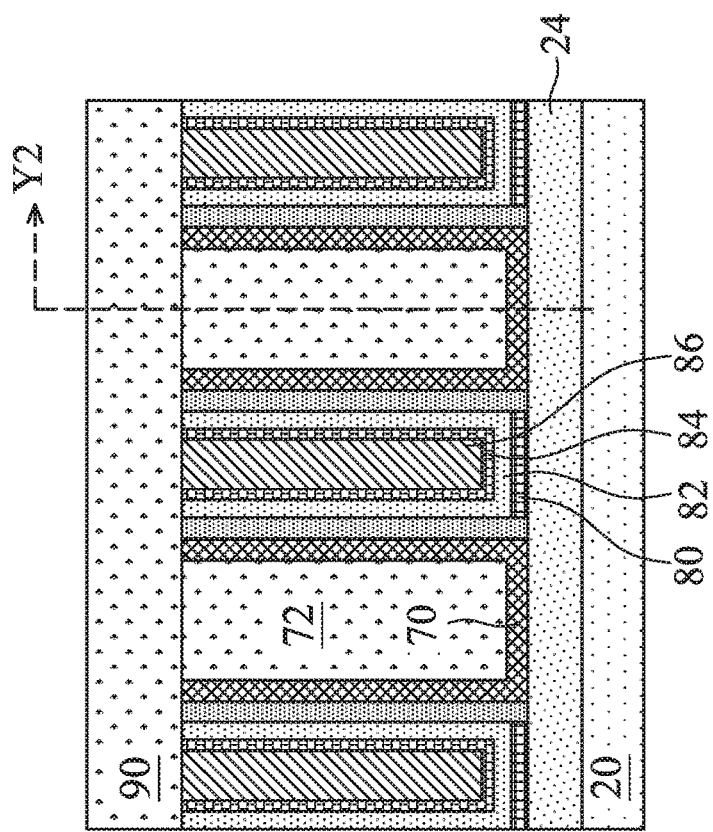
Figure 8D:
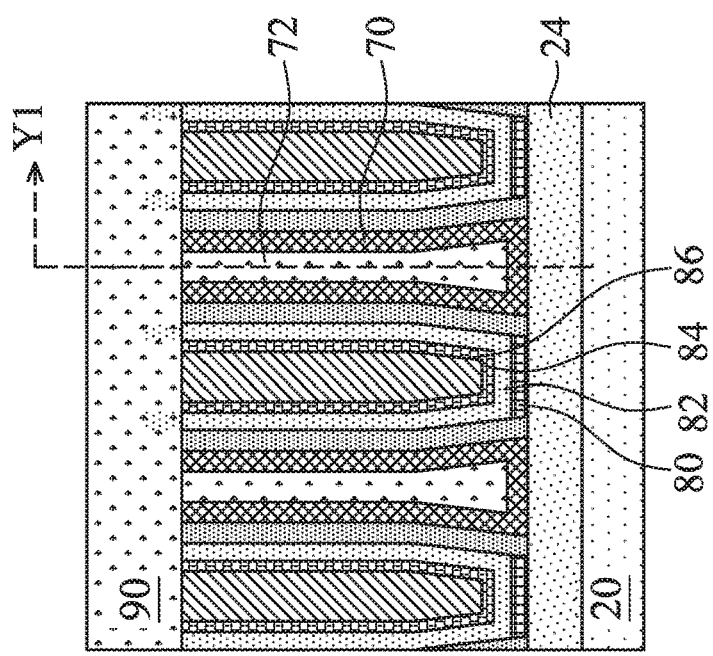
Figure 8E:
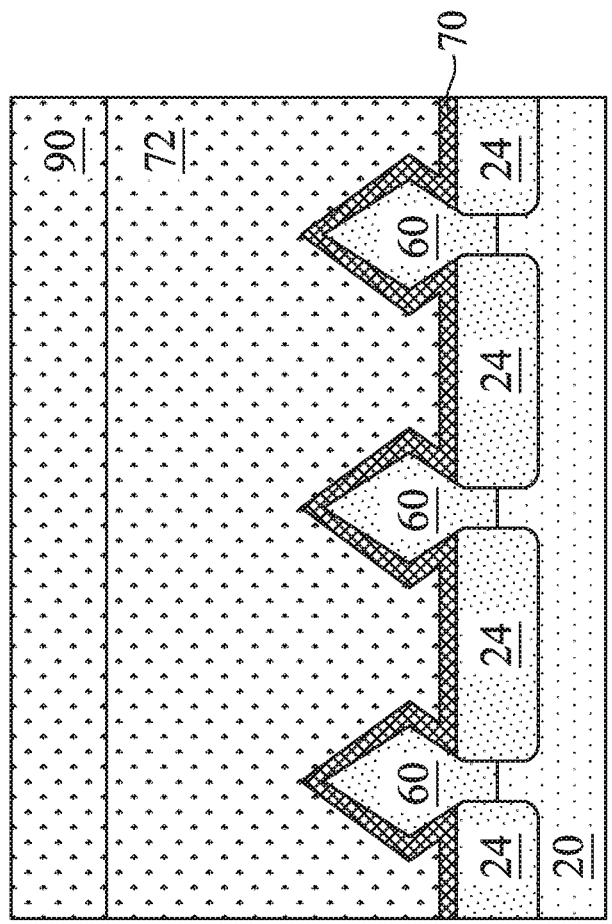

FIGS. 2A through 2E illustrate the formation of an interfacial dielectric layer 30, dummy gate layer 32, and masks 34. FIG. 2E is a perspective view of the interfacial dielectric layer 30, dummy gate layer 32, and masks 34 formed on the semiconductor substrate 20. FIG. 2E shows a cross-section X1 along a longitudinal direction of a fin 22 (e.g., across source/drain regions and channel regions that will be formed in the fin 22). FIG. 2A and subsequent figures having an "A" designation correspond to the cross-section X1 in a small gate pitch region 10 at respective stages of the example process, and FIG. 2B and subsequent figures having a "B" designation correspond to the cross-section X1 in a large gate pitch region 12 at respective stages of the example process. FIG. 2E shows a cross-section X2 parallel to the cross-section X1 and between neighboring fins 22. FIG. 2C and subsequent figures having a "C" designation correspond to the cross-section X2 in the small gate pitch region 10 at respective stages of the example process, and FIG. 2D and subsequent figures having a "D" designation correspond to the cross-section X2 in the large gate pitch region 12 at respective stages of the example process. FIGS. 2C and 2D further illustrate a top fin level 22A (at a level of top surfaces of the fins 22) for ease of reference between different cross-sections. FIG. 2E further shows cross-sections Y1 and Y2, which are across source/drain regions (to be formed subsequently) of different fins 22 in the small gate pitch region 10 and the large gate pitch region 12, respectively, and are perpendicular to the cross-sections X1 and X2. FIG. 8E corresponds to the cross-sections Y1 and Y2 after intervening processing. Although the small gate pitch region 10 and the large gate pitch region 12 are illustrated as being next to each other in FIG. 2E, the small gate pitch region 10 and the large gate pitch region 12 can be at any locations on the semiconductor substrate 20.

The interfacial dielectric layer 30 is formed conformally on the fins 22 and, in some instances, on the isolation regions 24. The interfacial dielectric layer 30 may include or be silicon oxide, silicon nitride, the like, or multilayers thereof. The interfacial dielectric layer 30 may be formed by an oxidation process, a conformal deposition process, the like, or a combination thereof. The dummy gate layer 32 is deposited on the interfacial dielectric layer 30. The dummy gate layer 32 may include or be silicon (e.g., amorphous silicon or polysilicon) or another material. The dummy gate layer 32 may be deposited by chemical vapor deposition (CVD) or the like. For example, the dummy gate layer 32 can be deposited using a reduced pressure CVD (RPCVD), which may further include using a cyclic deposition-etch process. In some examples, the dummy gate layer 32 is deposited as amorphous silicon and is crystallized into polysilicon during subsequent higher temperature processing. The dummy gate layer 32 is planarized, such as by a chemical mechanical planarization (CMP), after being deposited.

A mask layer is formed over the dummy gate layer 32. The mask layer may include or be silicon nitride, silicon oxynitride, silicon carbon nitride, the like, or a combination thereof. The mask layer can be formed by CVD, physical vapor deposition (PVD), the like, or a combination thereof. The mask layer is then patterned, for example, using photolithography and one or more etch processes, into the masks 34. A first width W1 is between neighboring pairs of the masks 34 in the small gate pitch region 10, and a second width W2 is between neighboring pairs of the masks 34 in the large gate pitch region 12. The first width W1 is less than the second width W2. In some examples, the second width W2 is in a range from about 3 nm to about 300 nm larger than the first width W1. In some examples, the first width W1 is in a range from about 10 nm to about 50 nm, and the second width W2 is in a range from about 50 nm to about 200 nm. Hence, in some examples, the small gate pitch region 10 may be referred to as a pattern dense region, and the large gate pitch region 12 may be referred to as a pattern sparse region.

Figure 3A:
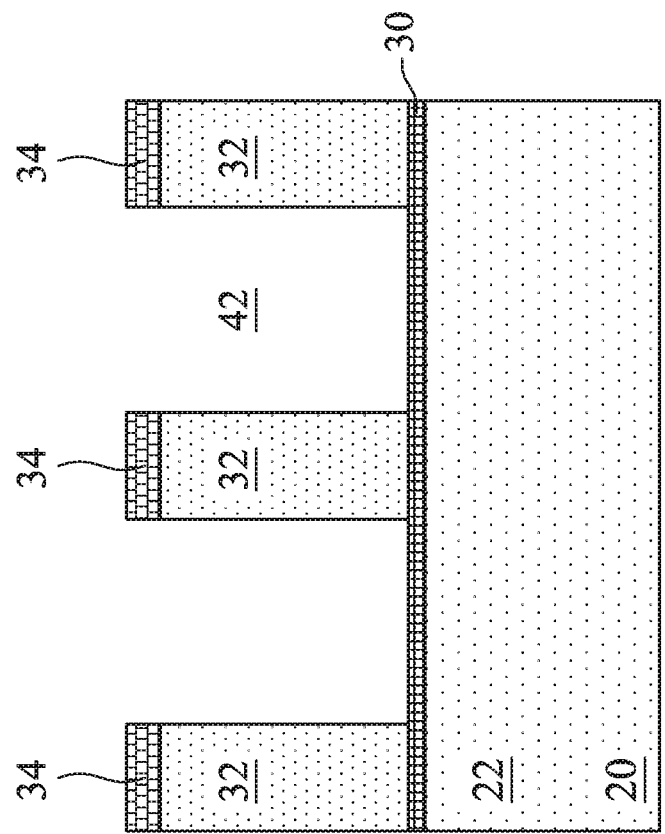
Figure 3B:
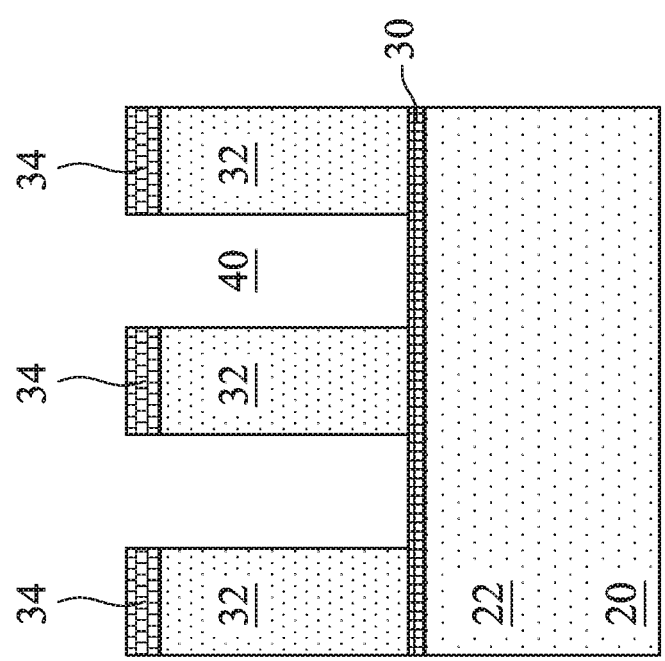
Figure 3C:
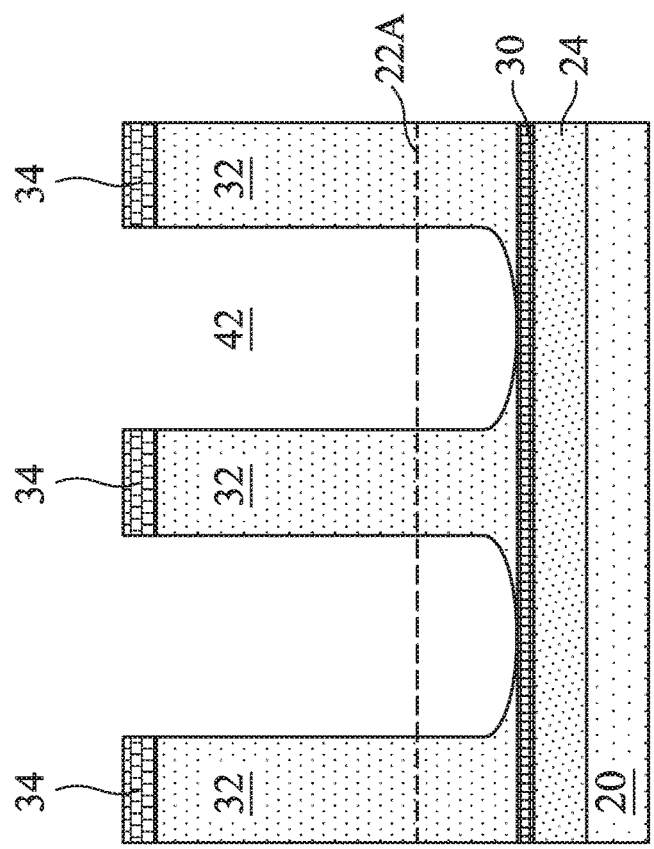
Figure 3D:
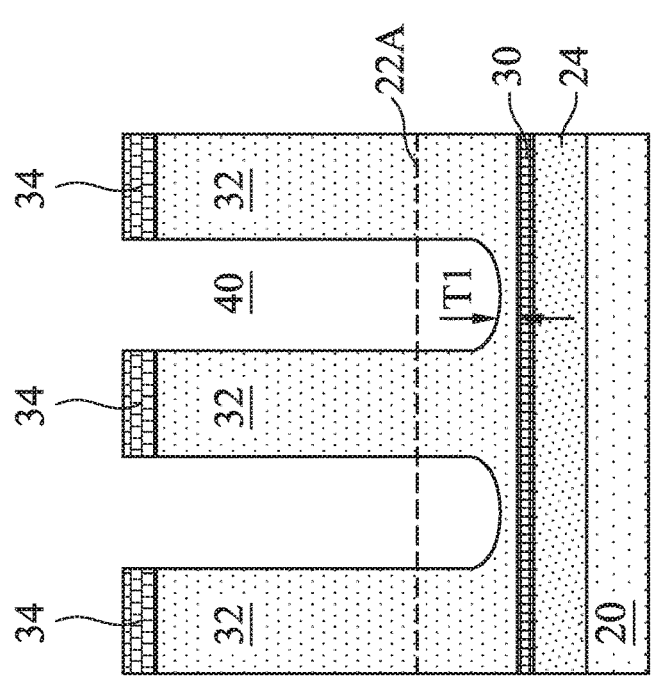

FIGS. 3A through 3D illustrate performing an etch process on the dummy gate layer 32 while being masked by the masks 34. The etching in the small gate pitch region 10, as shown in FIGS. 3A and 3C, forms first trenches 40 in the dummy gate layer 32 defined between neighboring masks 34, and the etching in the large gate pitch region 12, as shown in FIGS. 3B and 3D, forms second trenches 42 in the dummy gate layer 32 defined between neighboring masks 34. In some examples, the etch process is an anisotropic etching, such as a reactive ion etch (RIE) or the like. An RIE process is implemented in some examples. An etchant gas of the RIE process can include chlorine ($Cl_2$), a chlorine-based gas, hydrogen bromide (HBr), the like, or a combination thereof. A flow rate of the etchant gas in the RIE process can be in a range from about 5 sccm to about 1000 sccm. A pressure of the RIE process can be in a range from about 3 mTorr to about 300 mTorr. A power of a plasma generator of the RIE process can be in a range from about 5 W to about 3000 W, and a frequency of the plasma generator can be in a range from about 10 MHz to about 20 MHz, such as 13.56 MHz. A substrate bias during the RIE process may be in a range from about 50 V to about 2000 V.

According to some embodiments, a loading effect occurs during the etching of the dummy gate layer 32 in FIGS. 3A through 3D. The loading effect results in a greater etching rate of the dummy gate layer 32 in the large gate pitch region 12 (e.g., FIGS. 3B and 3D) than in the small gate pitch region 10 (e.g., FIGS. 3A and 3C). Hence, as illustrated in FIGS. 3C and 3D, the second trenches 42 in the dummy gate layer 32 in the large gate pitch region 12 are etched to a greater depth than the first trenches 40 in the dummy gate layer 32 in the small gate pitch region 10. As illustrated in FIG. 3D, the second trenches 42 may be etched to a depth to the interfacial dielectric layer 30 on the corresponding isolation region 24 and between neighboring fins 22. Footing projections may remain on the dummy gate layer 32 at the bottom of the second trenches 42, as shown. As illustrated in FIG. 3C, the first trenches 40 are etched to a depth that does not extend to the interfacial dielectric layer 30 on the corresponding isolation region 24 and between neighboring fins 22. A first thickness T1 of the dummy gate layer 32 remains at the respective bottom of the first trench 40 and on the interfacial dielectric layer 30 on the corresponding isolation region 24. In some examples, an aspect ratio of the first trenches 40 is in a range from about 3 to about 6, and an aspect ratio of the second trenches 42 is in a range from about 0.5 to about 3. The aspect ratios can be affected by the loading effect of the etching.

FIGS. 4A through 4D illustrate forming an etch barrier 50 along the surfaces of the first trenches 40 and the second trenches 42 and along exposed surfaces of the masks 34. The etch barrier 50 includes a layer that is deposited, respective treated portions of the dummy gate layer 32 and masks 34, or a combination thereof. The etch barrier 50 has varying thicknesses as a function of location of the etch barrier 50. As will be described in more detail below, the varying thicknesses permit the etch barrier 50 to be removed at different locations on the dummy gate layer 32 after different durations during a subsequently etch process. Hence, the dummy gate layer 32 can become exposed to the etch process, and hence, be etched, beginning at different times during the etch process at different locations.

The etch barrier 50 can be formed by a plasma treatment, a wet process, depositing a layer, or a combination thereof. In some examples, the etch barrier 50 is formed using a plasma treatment. The plasma treatment can be performed in a same tool (e.g., in situ) or different tool than the preceding and/or subsequent etch processes. In some examples, the plasma treatment is implemented in an inductively coupled plasma (ICP) tool. A reactant gas of the plasma treatment can include oxygen ($O_2$), nitrogen ($N_2$), carbon dioxide ($CO_2$), sulfur dioxide ($SO_2$), the like, or a combination thereof. A flow rate of the reactant gas in the plasma treatment can be in a range from about 10 sccm to about 100 sccm. A carrier gas, such as argon (Ar) or the like, can be flowed with the reactant gas. A pressure of the plasma treatment can be in a range from about 1 mTorr to about 200 mTorr. A power of a plasma generator of the plasma treatment can be in a range from about 10 W to about 2000 W, and a frequency of the plasma generator can be in a range from about 5 MHz to about 20 MHz, such as 13.56 MHz. A substrate bias during the plasma treatment may be in a range from about 0 V to about 500 V. The plasma treatment can passivate exposed surfaces of the dummy gate layer 32 and masks 34 with a species of the reactant gas (e.g., oxygen (O) when the reactant gas includes oxygen ($O_2$)), and can cause the species to diffuse into some depth of the dummy gate layer 32 and masks 34 from the respective exposed surfaces.

In some examples, the etch barrier 50 is formed using a wet process. The wet process can include immersing the structures on the semiconductor substrate 20 in a solution or spraying or rinsing a solution on the structures. The solution can include deionized (DI) water mixed with ozone ($O_3$), carbon dioxide ($CO_2$), the like, or a combination thereof. A temperature of the wet process can be in a range from about 4° C. to about 80° C. The wet process can, like the plasma treatment, passivate exposed surfaces of the dummy gate layer 32 and masks 34 with a species of the solution (e.g., oxygen (O) from the DI water, ozone, and/or carbon dioxide), and can cause the species to diffuse into some depth of the dummy gate layer 32 and masks 34 from the respective exposed surfaces.

In some examples, the etch barrier 50 is formed using a conformal deposition process. In some embodiments, the conformal deposition is atomic layer deposition (ALD), CVD (e.g., plasma enhanced CVD (PECVD)), or the like. In some examples, the layer that is deposited as the etch barrier 50 by the conformal deposition process is or includes silicon nitride (SiN), silicon oxynitride (SiON), silicon carbide (SiC), silicon oxycarbide (SiOC), silicon oxide ($SiO_2$), the like, or a combination thereof. The conformal deposition forms the layer along exposed surfaces of the dummy gate layer 32 and masks 34.

Figure 4D:
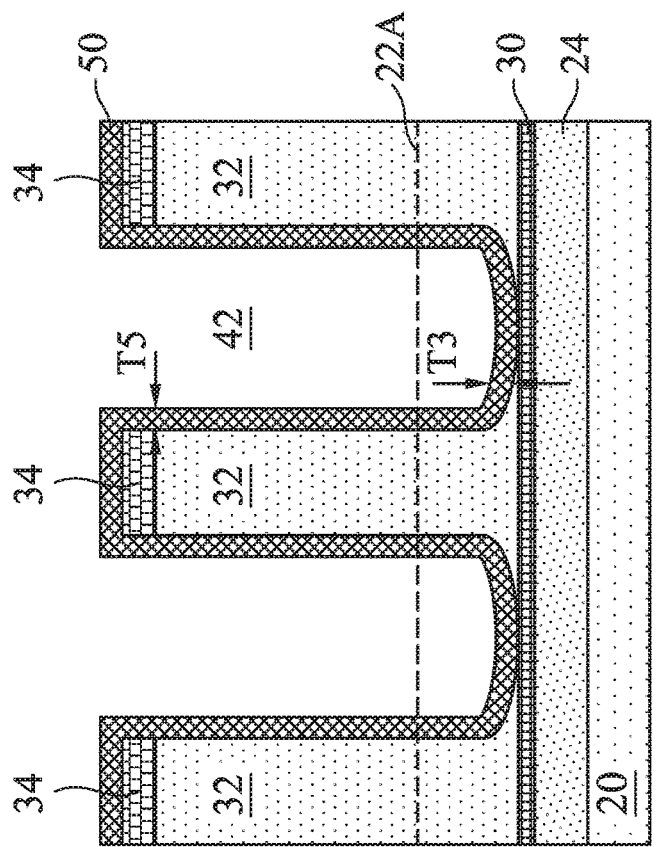
Figure 4C:
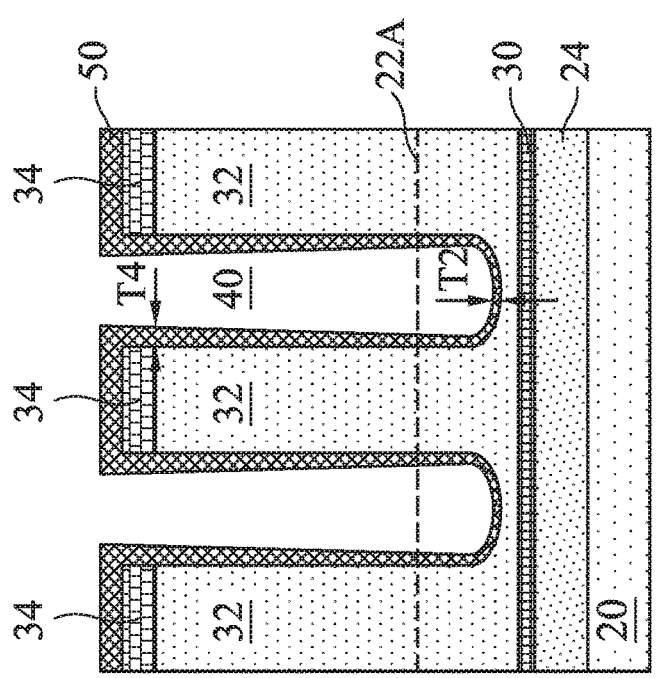

According to some embodiments, a loading effect causes the etch barrier 50 to be formed with greater thicknesses along surfaces of the second trenches 42 than along surfaces of the first trenches 40. Fluids (e.g., gases and/or liquids) used to form the etch barrier 50 may more easily reach to bottom surfaces of the second trenches 42 relative to the first trenches 40 due to the larger second width W2 of the second trenches 42 relative to the first width W1 of the first trenches 40. Hence, more fluids may reach the bottom regions of the second trenches 42 to form a thicker etch barrier 50 in those regions compared to a thinner etch barrier 50 formed in bottom regions of the first trenches. FIGS. 4C and 4D illustrate a second thickness T2 of the etch barrier 50 at bottom regions of the first trenches 40 and a third thickness T3 of the etch barrier 50 at bottom regions of the second trenches 42. The third thickness T3 is greater than the second thickness T2. In some examples, the second thickness T2 is in a range from about 2 Å to about 40 Å, and the third thickness T3 is in a range from about 2 Å to about 40 Å. A ratio of the second thickness T2 to the third thickness T3 can be less than about 0.6, such as in a range from about 0.2 to about 0.6.

The loading effect can further cause thicknesses of the etch barrier 50 to vary within each of the first trenches 40 and the second trenches 42. The fluids used to form the etch barrier 50 may more easily reach upper regions of a trench than lower regions, which can cause the etch barrier 50 to have a decreasing thickness as depth of the respective trench increases. As illustrated, the etch barrier 50 has a fourth thickness T4 at upper regions of the first trenches 40 and a fifth thickness T5 at upper regions of the second trenches 42. The fourth thickness T4 and fifth thickness T5 may be substantially equal and may each be in a range from about 2 Å to about 40 Å. A ratio of the second thickness T2 to the fourth thickness T4 can be less than about 0.6, such as in a range from about 0.2 to about 0.6. A ratio of the third thickness T3 to the fifth thickness T5 can be in a range from about 0.3 to about 1.

FIGS. 5A through 5D illustrate etching the etch barrier 50 and the dummy gate layer 32 at least in the small gate pitch region 10. The etch process is an isotropic etch that etches the etch barrier 50 and the dummy gate layer 32. During the etch process, portions of the etch barrier 50 that are thinner (such as at bottom regions of the first trenches 40) are removed to expose the respective portions of the dummy gate layer 32 before portions of the etch barrier 50 that are thicker are removed. For example, the etch barrier 50 having the second thickness T2 in bottom regions of the first trenches 40 is removed (and thereby exposes portions of the dummy gate layer 32 that defines the first trenches 40) before the etch barrier 50 having the third thickness T3 in bottom regions of the second trenches 42 is removed. Once the etch barrier 50 is removed, the dummy gate layer 32 is etched isotropically. The etch process can etch the dummy gate layer 32 at a faster rate than the etch barrier 50. Since different portions of the etch barrier 50 are removed at different times during the etch process, different portions of the dummy gate layer 32 are isotropically etched during the etch process. More particularly, the dummy gate layer 32 at the bottom regions of the first trenches 40 (where the etch barrier 50 with the small second thickness T2 was formed) are etched to form a tapered profile of the dummy gate layer 32 at lower portions of the dummy gate layer 32 in the small gate pitch region 10. Similarly, the dummy gate layer 32 in the large gate pitch region 12 may be etched at bottom regions of the second trenches 42. In some examples, the dummy gate layer 32 at the bottom regions of the second trenches 42 can be etched to form a tapered profile of the dummy gate layer 32 at lower portions of the dummy gate layer 32 in the large gate pitch region 12 or may form the dummy gate layer 32 to have vertical sidewalls in the large gate pitch region 12.

Figure 5A:
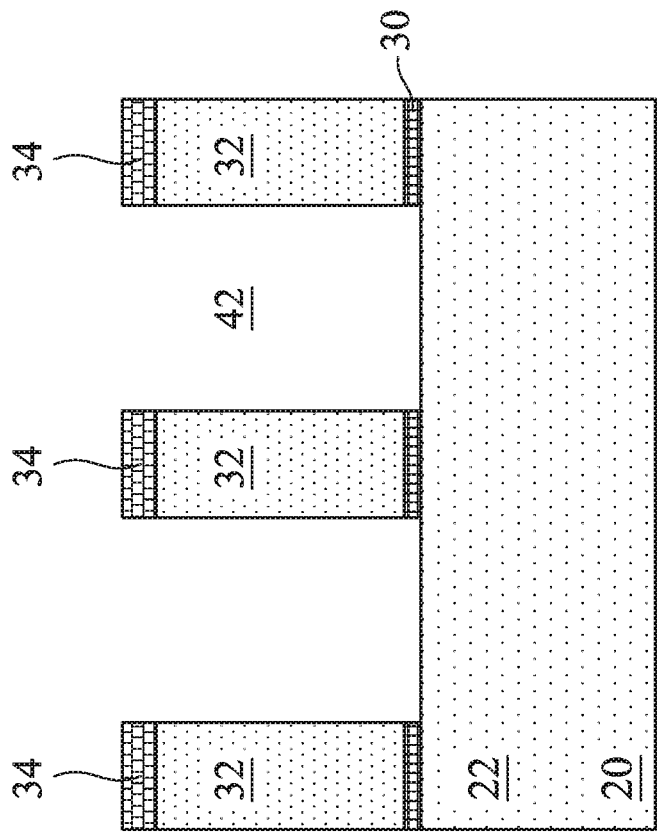
Figure 5B:
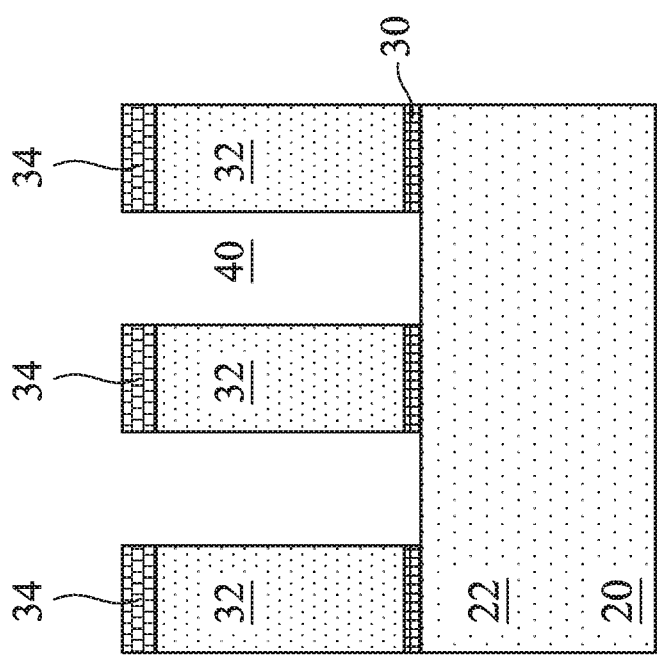
Figure 5C:
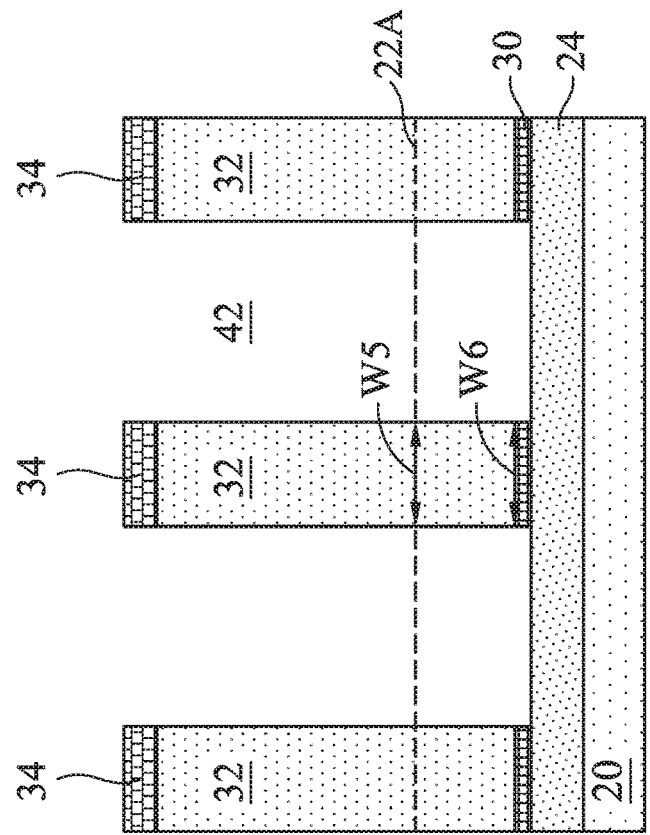
Figure 5D:
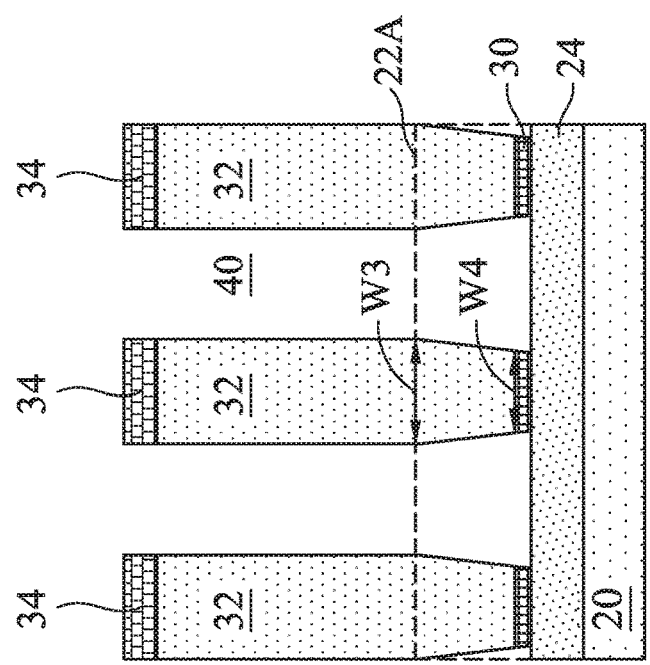

As illustrated in FIG. 5C, the dummy gate layer 32 in the small gate pitch region 10 has a third width W3 at the top fin level 22A and a fourth width W4 at the bottom surface of the dummy gate layer 32. The fourth width W4 is less than the third width W3. As illustrated in FIG. 5D, the dummy gate layer 32 in the large gate pitch region 12 has a fifth width W5 at the top fin level 22A and a sixth width W6 at the bottom surface of the dummy gate layer 32. The sixth width W6 can be equal to or less than the fifth width W5. A first gate profile difference is the difference of the fourth width W4 from the third width W3 (e.g., third width W3 minus fourth width W4), and a second gate profile difference is the difference of the sixth width W6 from the fifth width W5 (e.g., fifth width W5 minus sixth width W6). The first gate profile difference (e.g., W3-W4) can be in a range from about 0.3 nm to about 20 nm, and the second gate profile difference (e.g., W5-W6) can be in a range from about −5 nm to about 20 nm. The first gate profile difference (e.g., W3-W4) is greater than the second gate profile difference (e.g., W5-W6), such as by an amount equal to or greater than about 0.5 nm, such as in a range from about 0.5 nm to about 5 nm.

In some examples, the etch process of FIGS. 5A through 5D is an isotropic etching, such as a RIE or the like. An RIE process is implemented in some examples. An etchant gas of the RIE process can include hydrogen bromide (HBr), chlorine ($Cl_2$), a carbon fluoride ($C_xF_y$), the like, or a combination thereof. Another gas, such as oxygen ($O_2$), can be flowed as an etching inhibitor during the etch process. A flow rate of the etchant gas in the RIE process can be in a range from about 1 sccm to about 2000 sccm. The inhibitor gas can be flowed in a range from about 1 sccm to about 300 sccm. A ratio of the flow rates of the etchant gas to the inhibitor gas can be in a range from about 3:1 to about 10:1. Including the inhibitor gas in the RIE process can retard or inhibit etching at upper regions of the first trenches 40 and the second trenches 42. A pressure of the RIE process can be in a range from about 2 mTorr to about 300 mTorr. A power of a plasma generator of the RIE process can be in a range from about 10 W to about 2000 W, and a frequency of the plasma generator can be in a range from about 10 MHz to about 20 MHz, such as 13.56 MHz. A substrate bias during the RIE process may be in a range from about 0 V to about 1000 V.

After the etch process of FIGS. 5A through 5D, the first trenches 40 and second trenches 42 extend through the dummy gate layer 32 to form individual dummy gate layers 32 that, in part, form different dummy gate stacks. The dummy gate stacks extend longitudinally perpendicularly to respective longitudinal directions of the fins 22. Each dummy gate stack includes an interfacial dielectric layer 30, a dummy gate layer 32, and a mask 34, as shown. In some examples, portions of the etch barrier 50 may remain after the etch process of FIGS. 5A through 5D, and in such examples, the etch barrier 50 may be removed by an etch selective to the material of the etch barrier 50.

The formation of an etch barrier and performance of a subsequent etch process may be performed cyclically and repeatedly to form various profiles of the dummy gate layers 32. For example, by repeatedly forming an etch barrier and performing an etch process, tapering of the dummy gate layers 32 in the small gate pitch region 10 and in the large gate pitch region 12 can be increased (e.g., the first gate profile difference (e.g., W3-W4) and the second gate profile difference (e.g., W5-W6) can each be increased).

FIGS. 6A through 6D illustrate the formation of gate spacers 44 and epitaxial source/drain regions 60. The gate spacers 44 are formed along sidewalls of the dummy gate stacks and over the fins 22. The gate spacers 44 may be formed by conformally depositing one or more layers for the gate spacers 44 and anisotropically etching the one or more layers, for example, by appropriate processes. The one or more layers for the gate spacers 44 may include or be silicon nitride, silicon oxynitride, silicon carbon nitride, the like, multi-layers thereof, or a combination thereof. The conformal deposition of the one or more layers implemented to form the gate spacers 44 causes the gate spacers 44 to conform to the sidewalls (e.g., the tapered profile) of the dummy gate stacks, such as the dummy gate layers 32.

Recesses are then formed in the fins 22 on opposing sides of the dummy gate stacks. The recessing can be by an etch process. The etch process can be isotropic or anisotropic, or further, may be selective with respect to one or more crystalline planes of the semiconductor substrate 20. Hence, the recesses can have various cross-sectional profiles based on the etch process implemented.

Epitaxial source/drain regions 60 are formed in the recesses. The epitaxial source/drain regions 60 may include or be silicon germanium, germanium, silicon carbide, silicon phosphorus, silicon carbon phosphorus, a III-V compound semiconductor, a II-VI compound semiconductor, or the like. The epitaxial source/drain regions 60 may be formed in the recesses by epitaxial growth with appropriate deposition processes. In some examples, epitaxial source/drain regions 60 may be formed with facets (which may correspond to crystalline planes of the semiconductor substrate 20), and may be formed at a raised height with respect to the respective fin 22, such as shown in FIGS. 6A and 6B. In some examples, epitaxial source/drain regions 60 in neighboring fins 22 can be epitaxially grown to merge together, while other fins 22 can have respective epitaxial source/drain regions 60 that do not merge with another epitaxial source/drain region, such as due to proximity of the neighboring fins 22. Examples illustrated in the figures have epitaxial source/drain regions 60 that do not merge, although other examples include merged epitaxial source/drain regions.

In some examples, the epitaxial source/drain regions 60 may also be doped, such as by in situ doping during epitaxial growth and/or by implanting dopants into the epitaxial source/drain regions 60 after epitaxial growth. Hence, a source/drain region may be delineated by doping (e.g., by in situ doping during epitaxial growth) and/or by epitaxial growth, which may further delineate the active area in which the source/drain region is delineated.

Figure 6C:
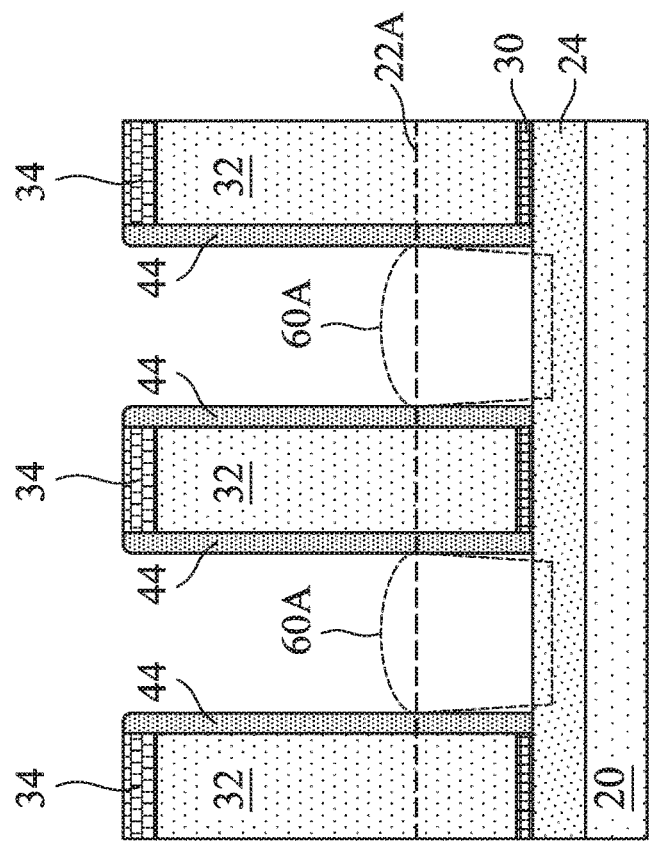
Figure 6D:
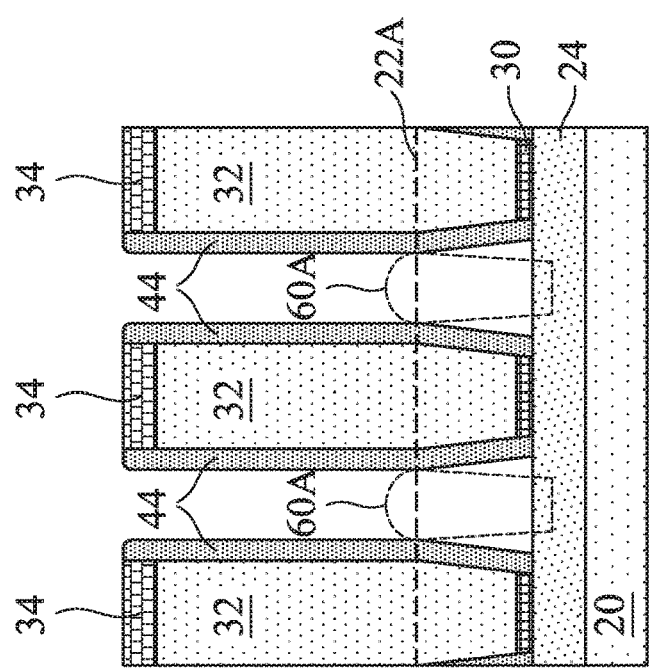
Figure 7A:
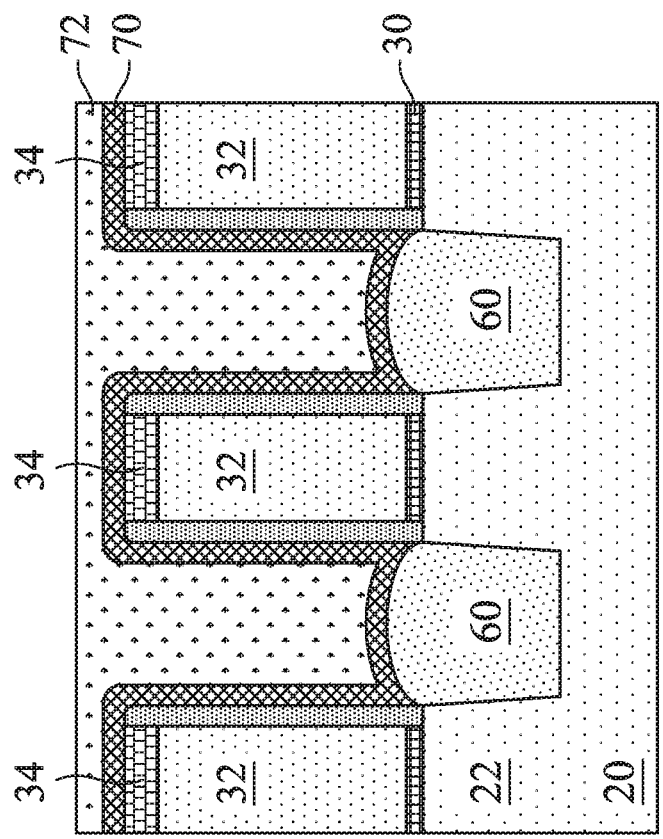
Figure 7B:
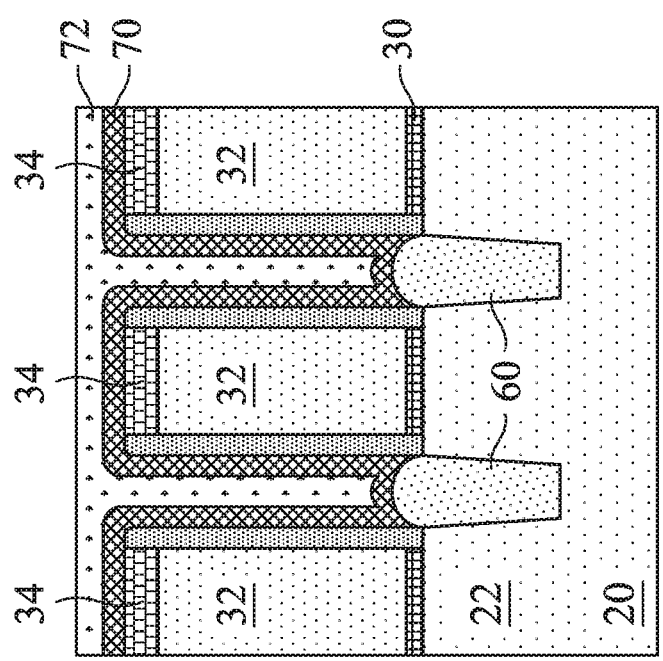
Figure 7D:
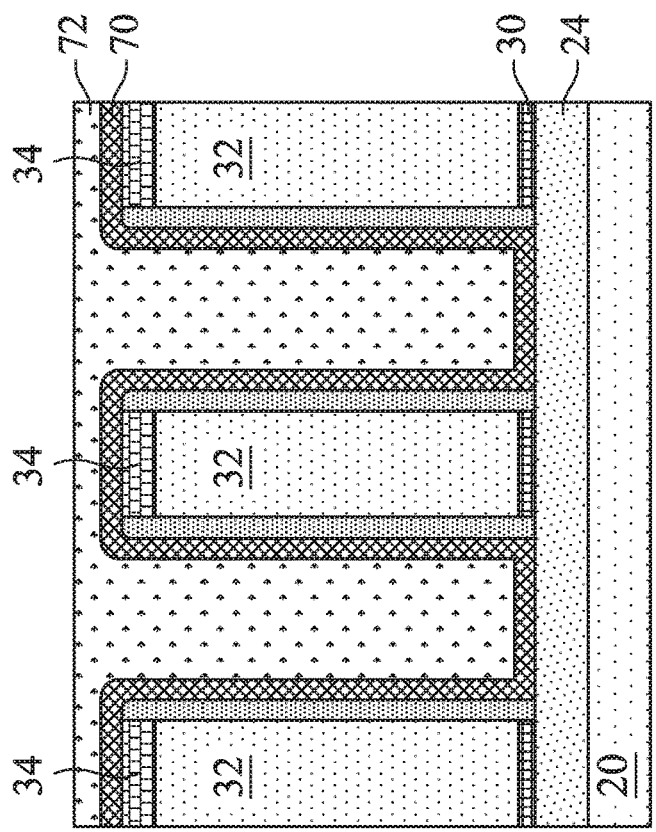
Figure 7C:
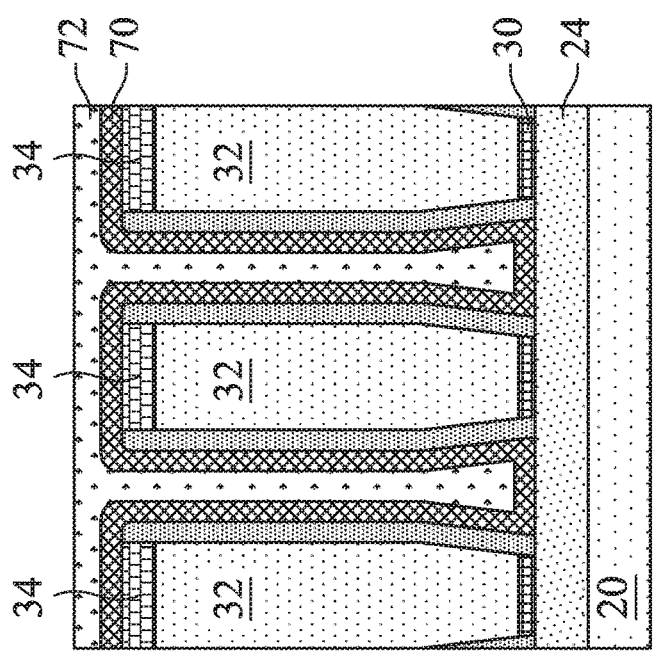

Profiles 60A of the epitaxial source/drain regions 60 are illustrated in FIGS. 6C and 6D. FIG. 6C illustrates a first dimension D1 at a level of a bottom surface of the dummy gate layer 32 of a dummy gate stack in the small gate pitch region 10. The first dimension is from a sidewall of the dummy gate layer 32 (at an interface with the respective gate spacer 44) to a surface of the epitaxial source/drain region 60 and approximately along a sidewall of the fin 22. With the tapered profile of the dummy gate layer 32, the first dimension D1 can be increased, which can result in a decrease in a capacitance effect between the replacement gate structure (subsequently formed) and the epitaxial source/drain region 60.

FIGS. 7A through 7D illustrate the formation of a contact etch stop layer (CESL) 70 and a first interlayer dielectric (ILD) 72. The CESL 70 is conformally deposited on surfaces of the epitaxial source/drain regions 60, sidewalls and top surfaces of the gate spacers 44, top surfaces of the masks 34, and top surfaces of the isolation regions 24. Generally, an etch stop layer (ESL) can provide a mechanism to stop an etch process when forming, e.g., contacts or vias by having a different etch selectivity from adjacent layers or components. The CESL 70 may comprise or be silicon nitride, silicon carbon nitride, carbon nitride, the like, or a combination thereof, and may be deposited by any appropriate conformal deposition process.

The first ILD 72 is formed over the CESL 70. The first ILD 72 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, silicon carbon material, a compound thereof, a composite thereof, the like, or a combination thereof. The first ILD 72 may be deposited by any acceptable deposition process.

FIGS. 8A through 8E illustrate the replacement of dummy gate stacks with replacement gate structures. The first ILD 72 and CESL 70 are formed with top surfaces coplanar with top surfaces of the dummy gate layers 32, such as by a planarization process, such as a CMP. The CMP may also remove the masks 34 (and, in some instances, upper portions of the gate spacers 44) on the dummy gate layers 32. Accordingly, top surfaces of the dummy gate layers 32 are exposed through the first ILD 72 and the CESL 70. With the dummy gate layers 32 exposed through the first ILD 72 and the CESL 70, the dummy gate layers 32 are removed, such as by one or more acceptable etch processes. Recesses are formed between gate spacers 44 where the dummy gate stacks are removed, and channel regions of the fins 22 are exposed through the recesses.

The replacement gate structures are formed in the recesses where the dummy gate stacks were removed. The replacement gate structures each include, as illustrated, an interfacial dielectric layer 80, a gate dielectric layer 82, one or more optional conformal layers 84, and a gate conductive fill material 86. The interfacial dielectric layer 80, gate dielectric layer 82, one or more optional conformal layers 84, and gate conductive fill material 86 can be deposited by any appropriate deposition technique. The interfacial dielectric layer 80 is formed on sidewalls and top surfaces of the fins 22 along the channel regions. The interfacial dielectric layer 80 can be, for example, the interfacial dielectric layer 30 if not removed, an oxide (e.g., silicon oxide), a nitride (e.g., silicon nitride), and/or another dielectric layer.

The gate dielectric layer 82 can be conformally deposited in the recesses where dummy gate stacks were removed (e.g., on top surfaces of the isolation regions 24 and the interfacial dielectric layer 80, and on sidewalls of the gate spacers 44) and on the top surfaces of the first ILD 72, the CESL 70, and gate spacers 44. The gate dielectric layer 82 can be or include silicon oxide, silicon nitride, a high-k dielectric material, multilayers thereof, or other dielectric material. A high-k dielectric material may include a metal oxide of or a metal silicate of hafnium (Hf), aluminum (Al), zirconium (Zr), lanthanum (La), magnesium (Mg), barium (Ba), titanium (Ti), lead (Pb), or a combination thereof.

Then, the one or more optional conformal layers 84 can be conformally (and sequentially, if more than one) deposited on the gate dielectric layer 82. The one or more optional conformal layers 84 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 86 is formed over the one or more optional conformal layers 84, if implemented, and/or the gate dielectric layer 82. The gate conductive fill material 86 can fill remaining recesses where the dummy gate stacks were removed. The gate conductive fill material 86 may be or comprise a metal-containing material such as tungsten, cobalt, aluminum, ruthenium, copper, multi-layers thereof, a combination thereof, or the like. A planarization process, such as a CMP, may remove excess gate conductive fill material 86, one or more optional conformal layers 84, and gate dielectric layer 82. The replacement gate structures comprising the gate conductive fill material 86, one or more optional conformal layers 84, gate dielectric layer 82, and interfacial dielectric layer 80 may therefore be formed as illustrated in FIGS. 8A through 8D.

The gate spacers 44 are not significantly etched during the removal of the dummy gate stacks. Hence, the conformal deposition of the gate dielectric layer 82 causes the gate dielectric layer 82 to have sidewalls conforming to the sidewalls of the gate spacers 44. Each subsequently deposited layer similarly has conforming sidewalls. In at least the small gate pitch region 10, this conformal deposition causes the sidewalls to have the tapered profile that was formed in the dummy gate layers 32 in FIGS. 5A through 5D.

A second ILD 900 is formed over the first ILD 72, CESL 70, gate spacers 44, and replacement gate structures. The second ILD 900 may comprise or be silicon dioxide, a low-k dielectric material, silicon oxynitride, PSG, BSG, BPSG, USG, FSG, OSG, $SiO_xC_y$, silicon carbon material, a compound thereof, a composite thereof, the like, or a combination thereof. The second ILD 900 may be deposited by any appropriate deposition process.

FIG. 8E illustrates a cross-section of cross-sections Y1 and Y2 shown in FIGS. 8A through 8D and corresponding to cross-sections Y1 and Y2 of FIG. 2E. The cross-section of FIG. 8E is illustrative, and similar cross-sections of devices formed in the small gate pitch region 10 may be different from or the same as similar cross-sections of devices formed in the large gate pitch region 12.

Although not illustrated, conductive features may be formed. For example, respective openings are formed through the second ILD 90, the first ILD 72, and the CESL 70 to expose at least a portion of respective epitaxial source/drain regions 60. The second ILD 90, the first ILD 72, and the CESL 70 may be patterned with the openings, for example, using photolithography and one or more etch processes.

After the formation of the source/drain contact openings, conductive features can be formed in the openings to the epitaxial source/drain regions 60. The conductive features may include a silicide region formed on the epitaxial source/ drain regions 60, an adhesion and/or barrier layer, and a conductive fill material on the adhesion and/or barrier layer. The silicide region may be formed by thermally reacting an upper portion of the epitaxial source/drain regions 60 with a metal layer, such as titanium, tantalum, or the like, formed on the epitaxial source/drain regions 60. The adhesion and/or barrier layer is conformally deposited in the openings. The adhesion and/or barrier layer may be or include titanium nitride, titanium oxide, tantalum nitride, tantalum oxide, any suitable transition metal nitrides or oxides, the like, or any combination thereof, and may be deposited by any suitable deposition technique. The conductive fill material may be or include cobalt, tungsten, copper, ruthenium, aluminum, gold, silver, alloys thereof, the like, or a combination thereof, and may be deposited by any suitable deposition technique. After the conductive material is deposited, excess conductive fill material and adhesion and/or barrier layer may be removed by using a planarization process, such as a CMP. The conductive features may be referred to as contacts, plugs, etc.

Some embodiments can achieve advantages. Some embodiments can obviate, and even reverse, a loading effect when patterning a dummy gate layer. In some implementations, FinFETs formed in a small gate pitch region are low voltage devices, whereas FinFETs formed in a large gate pitch region are high voltage devices. By having a tapered profile of the replacement gate structure in a low voltage device as described above, a gate-to-source capacitance can be reduced due to an increased distance between the gate and the source/drain region at a lower portion of the replacement gate structure. This can reduce an adverse effect, such as reducing leakage current, that can occur in FinFET. Embodiments may be implemented in any technology node, such as 16 nm and smaller.

An embodiment is a structure. The structure includes a first device region comprising first fin Field Effect Transistors (FinFETs) on a substrate and a second device region comprising second FinFETs on the substrate. A first distance between neighboring gate structures of the first FinFETs is less than a second distance between neighboring gate structures of the second FinFETs. A first gate structure of at least one of the first FinFETs has a first width at a level of a top surface of a first fin on which the first gate structure is disposed and a second width at a level below the top surface of the first fin. The first width is greater than the second width. A second gate structure of at least one of the second FinFETs has a third width at a level of a top surface of a second fin on which the second gate structure is disposed and a fourth width at a level below the top surface of the second fin. A difference between the first width and the second width is greater than a difference between the third width and the fourth width.

Another embodiment is a structure. The structure includes a first device region on a substrate and a second device region on the substrate. The first device region includes a first fin on the substrate, a first gate structure on the first fin, and a second gate structure on the first fin. The first gate structure has a first sidewall and a second sidewall on opposing sides. A first width is from the first sidewall to the second sidewall at level of a top surface of the first fin, and a second width is from the first sidewall to the second sidewall below the level of the top surface of the first fin. The first width is greater than the second width. The first gate structure and the second gate structure are neighboring gate structures, and the second gate structure has a third sidewall facing the first sidewall. Each of the first sidewall and the third sidewall has a respective upper portion distal from the first fin. A first dimension is from the upper portion of the first sidewall to the upper portion of the third sidewall. The second device region includes a second fin on the substrate, a third gate structure on the second fin, and a fourth gate structure on the second fin. The third gate structure has a fourth sidewall and a fifth sidewall on opposing sides. A third width is from the fourth sidewall to the fifth sidewall at level of a top surface of the second fin, and a fourth width is from the fourth sidewall to the fifth sidewall below the level of the top surface of the second fin. A difference between the first width and the second width is greater than a difference between the third width and the fourth width. The third gate structure and the fourth gate structure are neighboring gate structures, and the fourth gate structure has a sixth sidewall facing the fourth sidewall. Each of the fourth sidewall and the sixth sidewall has a respective upper portion distal from the second fin. A second dimension is from the upper portion of the fourth sidewall to the upper portion of the sixth sidewall. The first dimension is less than the second dimension.

A further embodiment is a method for semiconductor processing. A dummy gate layer is deposited over fins on a substrate. First trenches are etched in the dummy gate layer in a first region, and second trenches are etched in the dummy gate layer in a second region. A width of the first trenches is less than a width of the second trenches. An etch barrier is formed along surfaces of the first trenches and the second trenches. The etch barrier is formed with a greater thickness along bottom regions of the second trenches than along bottom regions of the first trenches. The etch barrier and the dummy gate layer are isotropically etched at the first trenches and the second trenches. After isotropically etching, first dummy gate stacks are formed in the first region and second dummy gate stacks are formed in the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor processing, the method comprising:
   depositing a dummy gate layer over fins on a substrate;
   etching first trenches in the dummy gate layer in a first region and second trenches in the dummy gate layer in a second region, a width of the first trenches being less than a width of the second trenches;
   forming an etch barrier along surfaces of the first trenches and the second trenches, the etch barrier being formed with a greater thickness along bottom regions of the second trenches than along bottom regions of the first trenches; and
   isotropically etching the etch barrier and the dummy gate layer at the first trenches and the second trenches, wherein after isotropically etching, first dummy gate stacks are formed in the first region and second dummy gate stacks are formed in the second region.

2. The method of claim 1, wherein forming the etch barrier comprises using a plasma process, a species of the plasma process at least passivating surfaces of the first trenches and the second trenches to form the etch barrier.

3. The method of claim 1, wherein forming the etch barrier comprises using a wet process, a species of the wet process at least passivating surfaces of the first trenches and the second trenches to form the etch barrier.

4. The method of claim 1, wherein forming the etch barrier comprises depositing the etch barrier using a conformal deposition process.

5. The method of claim 1, wherein before isotropically etching, respective thicknesses of the etch barrier increase from the bottom regions of the first trenches to top regions of the first trenches.

6. The method of claim 1, wherein isotropically etching the etch barrier and the dummy gate layer includes removing more of the dummy gate layer at the bottom regions of the first trenches than at the bottom regions of the second trenches.

7. The method of claim 1, wherein after isotropically etching:
each of the first dummy gate stacks have a first width and a second width at a location below the first width, the first width being greater than the second width;
each of the second dummy gate stacks have a third width and a fourth width at a location below the third width; and
a difference between the first width and the second width is greater than a difference between the third width and the fourth width.

8. The method of claim 7, wherein after isotropically etching, the third width is greater than the fourth width.

9. The method of claim 7, wherein after isotropically etching, the difference between the first width and the second width is at least 0.5 nm greater than the difference between the third width and the fourth width.

10. The method of claim 1 further comprising replacing the first dummy gate stacks and the second dummy gate stacks with respective replacement gate structures.

11. The method of claim 1 further comprising:
forming gate spacers along respective sidewalls of the first dummy gate stacks and the second dummy gate stacks;
depositing a dielectric layer on the first dummy gate stacks, the second dummy gate stacks, and the gate spacers;
after depositing the dielectric layer, removing the first dummy gate stacks and the second dummy gate stacks;
depositing a gate dielectric layer where the first dummy gate stacks and the second dummy gate stacks were removed; and
depositing a conductive fill material over the gate dielectric layer.

12. A method of semiconductor processing, the method comprising:
forming a first plurality of dummy gates and a second plurality of dummy gates over a substrate, wherein a first trench is interposed between two of the first plurality of dummy gates, wherein a second trench is interposed between two of the second plurality of dummy gates; wherein adjacent ones the second plurality of dummy gates are spaced farther apart than adjacent ones of the first plurality of dummy gates;
forming an etch barrier layer along sidewalls and a bottom of the first trench and along sidewalls and a bottom of the second trench, wherein a thickness of the etch barrier layer along the bottom of the second trench is greater than a thickness of the etch barrier layer along the bottom of the first trench; and
isotropically etching the etch barrier layer, wherein the isotropically etching thins the two of the first plurality of dummy gates by a greater amount than the two of the second plurality of dummy gates.

13. The method of claim 12, wherein a ratio of a thickness of the etch barrier layer at the bottom of the first trench to a thickness of the etch barrier layer at the bottom of the second trench is in a range from about 0.2 to about 0.6.

14. The method of claim 12, further comprising:
after isotropically etching, filling the first trench and the second trench with dielectric material; and
replacing the first plurality dummy gates with a first plurality of gate structures and replacing the second plurality of dummy gates with a second plurality of gate structures.

15. The method of claim 14, wherein the first plurality of gate structures each comprise a gate dielectric and a gate electrode, wherein the gate electrode widens as the gate electrode extends upward away from the substrate.

16. A method of semiconductor processing, the method comprising:
forming a first dummy gate and a second dummy gate in a first device region of a substrate, wherein a first trench is interposed between the first dummy gate and the second dummy gate;
forming a third dummy gate and a fourth dummy gate in a second device region of the substrate, wherein a second trench is interposed between the third dummy gate and the fourth dummy gate, wherein a distance between the first dummy gate and the second dummy gate is less than a distance between the third dummy gate and the fourth dummy gate;
forming an etch barrier layer along sidewalls and a bottom of the first trench and along sidewalls and a bottom of the second trench, wherein the etch barrier layer along the sidewalls and the bottom of the second trench is thicker than the etch barrier layer along the sidewalls and the bottom of the first trench, respectively;
etching the etch barrier layer along the sidewalls of the first trench and along sidewalls of the second trench, wherein the etching further removes material of the first dummy gate and the second dummy gate along a bottom of the first trench such that a width of the first dummy gate along a bottom of the first trench is less than a width of the first dummy gate at a top of the first trench; and
replacing the first dummy gate, the second dummy gate, third dummy gate and the fourth dummy gate with gate structures.

17. The method of claim 16, wherein the etching is performed by an isotropic reactive ion etch process.

18. The method of claim 16 further comprising forming a first spacer along a sidewall of the first dummy gate and a second spacer along a sidewall of the second dummy gate, wherein a distance between the first spacer and the second spacer at the bottom of the first trench is greater than a distance between the first spacer and the second spacer at the top of the first trench.

19. The method of claim 16, wherein etching the etch barrier layer removes more of the first dummy gate at a bottom of the first trench than at a top of the first trench.

20. The method of claim 16, wherein after etching the etch barrier layer:

the first dummy gate has a first width and a second width at a location below the first width, the first width being greater than the second width;
the third dummy gate has a third width and a fourth width at a location below the third width; and
a difference between the first width and the second width is greater than a difference between the third width and the fourth width.

* * * * *